(12) United States Patent
Yang et al.

(10) Patent No.: US 12,135,350 B2
(45) Date of Patent: Nov. 5, 2024

(54) ELECTRONIC COMPONENT TESTING SYSTEM AND TIME CERTIFICATION METHOD

(71) Applicants: Tzu-Ching Yang, Taoyuan (TW); Shih-Chao Lin, Taoyuan (TW)

(72) Inventors: Tzu-Ching Yang, Taoyuan (TW); Shih-Chao Lin, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 544 days.

(21) Appl. No.: 17/315,313

(22) Filed: May 9, 2021

(65) Prior Publication Data

US 2021/0349146 A1 Nov. 11, 2021

(30) Foreign Application Priority Data

May 11, 2020 (TW) .................................. 109115511

(51) Int. Cl.
*G01R 31/28* (2006.01)
*G01R 31/317* (2006.01)

(52) U.S. Cl.
CPC ..... *G01R 31/2889* (2013.01); *G01R 31/2849* (2013.01); *G01R 31/31719* (2013.01); *G01R 31/31726* (2013.01)

(58) Field of Classification Search
None
See application file for complete search history.

(56) References Cited

U.S. PATENT DOCUMENTS

| 9,648,086 | B2 * | 5/2017 | Amidei | ................. | H04L 67/10 |
| 2012/0084220 | A1 * | 4/2012 | Rider | ................. | G06Q 30/018 |
| | | | | | 705/317 |
| 2015/0052499 | A1 * | 2/2015 | Finch | ................. | G06F 11/3688 |
| | | | | | 717/124 |
| 2017/0060713 | A1 * | 3/2017 | Wang | ................. | G06F 16/2455 |
| 2020/0081825 | A1 * | 3/2020 | Parbhane | ............ | G06F 11/3664 |

FOREIGN PATENT DOCUMENTS

WO   WO-2008071627 A1 *  6/2008  ............... G04G 7/02

* cited by examiner

*Primary Examiner* — Jermele M Hollington

(57) ABSTRACT

Herein disclosed are an electronic component testing system and a time certification method. The electronic component testing system comprising a testing device and an interface device. The testing device comprises a backboard, and the backboard electrically connected to at least one test board and comprising a time certification component. The interface device, electrically connected to the testing device, provides a test instruction. Wherein the time certification component stores an authorization start time and an authorization end time. Wherein the testing device starts a test procedure according to the test instruction, the time certification component updates the authorization start time to a first stop time of the test procedure after the test procedure is completed.

15 Claims, 5 Drawing Sheets

ELECTRONIC COMPONENT TESTING SYSTEM AND TIME CERTIFICATION METHOD

CROSS REFERENCE TO RELATED APPLICATION

The present application claims priority to Taiwan patent application Serial No. 109115511 filed on, May 11, 2020, the entire content of which is incorporated by reference to this application.

BACKGROUND OF THE INVENTION

1. Field of the Invention

The present invention pertains to an electronic component testing system and a time certification method, in particular to an electronic component testing system and a time certification method that can check and update an authorization period.

2. Description of the Prior Art

Generally speaking, company may provide their machine to potential customers for trial with a limited authorization period as a sales strategy. The advantage is that the potential customer can install the machine on their production line, have sufficient trial time, and evaluate the machine's functions and benefits on site. However, there are some risks for the company. For example, if the potential customer does not purchase the machine or renew the limited authorization period, the industry may not be able to retrieve their machine smoothly since the machine is still at the potential customer's place. The potential customer may violate the spirit of the trial contract and use the machine overdue. Allowing the potential customer to use the machine overdue will not only cause losses to the company, but also give the potential customer an opportunity for cheating.

In order to solve the problem of overdue use of the machine by the potential customer, some companies will add an authority to an operating program of the machine to prevent the potential customer from continuing to use the machine without the authority. However, in practice, the authority to lock the operating program can easily be cracked or bypassed. For example, it is possible to avoid checking during the authorization period by modifying the internal time of the machine, so that it is not easy to achieve the purpose of preventing overdue use of the machine. Accordingly, the company needs a new system and method for checking the authorization period to ensure that potential customer cannot use the machine beyond the authorization period to reduce losses to the company.

SUMMARY OF THE INVENTION

The present invention provides an electronic component testing system. A time certification component is designed in the machine. The time certification component will determine and check the authorization period before starting a specific process. Because the time certification component is a hardware that can prevent from being bypassed. In addition, the time certification component will automatically update the authorization period, which can prevent the internal time of the machine from being modified to avoid checking the authorization period.

The present invention discloses an electronic component testing system comprising a testing device and an interface device. The testing device comprises a backboard, and the backboard electrically connected to at least one test board and comprising a time certification component. The interface device, electrically connected to the testing device, provides a test instruction. Wherein the time certification component stores an authorization start time and an authorization end time. Wherein the testing device starts a test procedure according to the test instruction, the time certification component updates the authorization start time to a first stop time of the test procedure after the test procedure is completed.

In some embodiment, when the testing device receives the test instruction, the time certification component checks whether a first execution time of the test instruction is later than the authorized start time to determine whether the testing device starts the test procedure. When the first execution time is later than the authorization start time, the time certification component generates a certification pass signal, and the testing device starts the test procedure according to the certification pass signal. When the first execution time is not later than the authorization start time, the time certification component does not generate the certification pass signal.

In some embodiment, when the testing device receives the test instruction, the time certification component checks whether the first execution time of the test instruction is earlier than the authorized end time to determine whether the testing device starts the test procedure. When the first execution time is earlier than the authorized end time, the time certification component generates a certification pass signal, and the testing device starts the test procedure according to the certification pass signal. When the first execution time is not earlier than the authorized end time, the time certification component does not generate the certification pass signal.

In some embodiment, before the time certification component updates the authorization start time to the first stop time, the time certification component checks whether the first execution time of the test instruction is earlier than the first stop time. When the first execution time is not earlier than the first stop time, the time certification component adds an internal timing value to the first execution time to obtain a real stop time, and the time certification component updates the authorization start time to the real stop time.

The present invention also provides a time certification method. The authorization period can be determined and checked by the time certification component before starting a specific process. In addition, the authorization period can be updated by the time certification component. Therefore, the present invention can prevent the internal time of the machine from being modified to avoid checking the authorization period.

The present invention also discloses a time certification method comprises the following steps. Providing a time certification component, storing an authorization start time and an authorization end time. Starting a test procedure according to a test instruction. Updating the authorization start time to a first stop time of the test procedure by the time certification component after the test procedure is completed.

In some embodiment, in the step of starting the test procedure according to the test instruction, the time certification method further comprises the following steps. Checking whether a first execution time of the test instruction is later than the authorized start time by the time certification component. Generating a certification pass signal by the time certification component when the first execution time is later than the authorization start time. And, starting the test procedure according to the certification pass signal. Besides, when the first execution time is not later than the authorization start time, the time certification component does not generate the certification pass signal.

In some embodiment, in the step of starting the test procedure according to the test instruction, the time certification method further comprises the following steps. Checking whether a first execution time of the test instruction is earlier than the authorized end time by the time certification component. Generating a certification pass signal by the time certification component when the first execution time is earlier than the authorized end time. Starting the test procedure according to the certification pass signal. Besides, when the first execution time is not earlier than the authorized end time, the time certification component does not generate the certification pass signal.

In some embodiment, before the step of updating the authorization start time to the first stop time of the test procedure, the time certification method further comprises the following steps. Checking whether a first execution time of the test instruction is earlier than the first stop time by the time certification component. Adding an internal timing value to the first execution time to obtain a real stop time by the time certification component when the first execution time is not earlier than the first stop time. Updating the authorization start time to the real stop time by the time certification component.

Based on the above, the electronic component testing system and the time certification method provided by the present invention comprise a time certification component, embedded in the machine that cannot be bypassed, to determine the authorization period. Therefore, the present invention can prevent the internal time of the machine from being modified to avoid checking the authorization period. In addition, the time certification component provided by the present invention can check whether the internal time of the machine has been modified before automatically updating the authorization period. If the time certification component determines that the internal time of the machine is incorrect or modified, it will update the authorization period time bases on its internal timing value.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
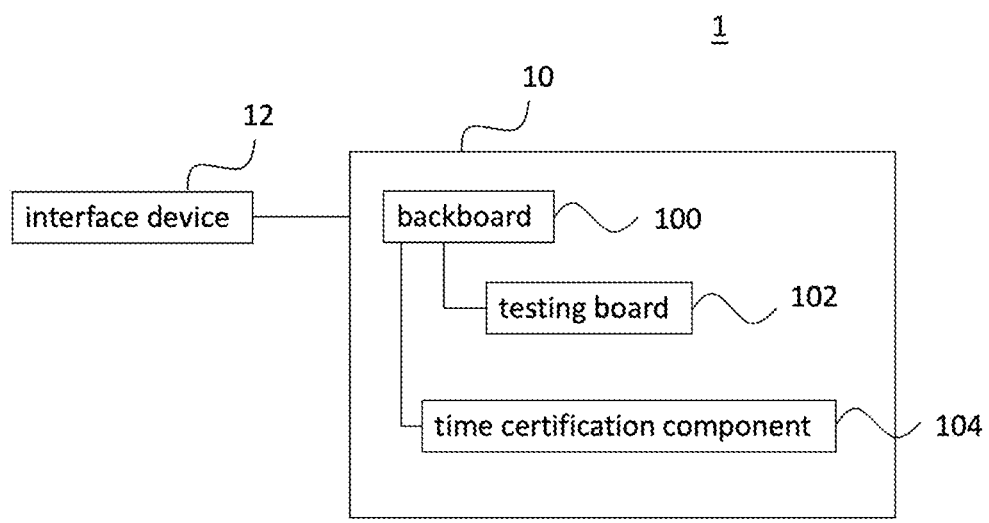
FIG. 1 is a block diagram of the electronic component testing system in accordance with an embodiment of the present invention.

Please refer to FIG. 1, FIG. 1 is a block diagram of the electronic component testing system in accordance with an embodiment of the present invention. As shown in FIG. 1, the electronic component testing system 1 of this embodiment comprises a testing device 10 and an interface device 12, and the testing device 10 is electrically connected to the interface device 12. In practice, the testing device 10 may be an automatic test equipment (ATE), and the interface device 12 may be a computer used to operate the automatic test equipment. In one example, the interface device 12 may have an operating program of the testing device 10, and the user can give a test instruction to the testing device 10 through the operating program of the interface device 12, and the test instruction can make the testing device 10 execute a corresponding test procedure. Of course, this embodiment does not limit the purpose of the testing device 10 or the test procedure, and person having ordinary skill in the art can apply to machines with different purposes. In addition, this embodiment does not limit the testing device 10 and the interface device 12 are wired or wirelessly connected, as long as the interface device 12 can be used to provide test instructions to the testing device 10, it should fall within the scope of this embodiment. The components of the electronic component testing system 1 are described below.

The testing device 10 comprises a backboard 100, and the backboard 100 is used to electrically connect to at least one testing board 102. Here, the testing board 102 may be a kind of function card which is detachably connected to the corresponding slot of the backboard 100, and can be used to execute the test procedure. In addition, the backboard 100 further includes a time certification component 104 which can be disposed on the backboard 100, and the time certification component 104 can store an authorization start time and an authorization end time. In practice, the time certification component 104 may be an electronic component with computing and storage functions, and the type of the time certification component 104 is not particularly limited in this embodiment. In one example, the authorization start time and the authorization end time indicate the time interval during which the testing device 10 is legally authorized to use. In other words, the testing device 10 can be used normally between the authorization start time and the authorization end time. In practice, when a company provides or installs the electronic component testing system 1, the authorization start time and authorization end time and be set in the time certification component 104 in the first place. Since the authorization start time and authorization end time are determined by the company, the authorization start time and authorization end time can be carefully checked. In one example, the authorization start time and the authorization end time do not necessarily refer to a specific time on a certain date, but may also be available hours. In addition, it can be seen from the above that the authorization start time and authorization end time are recorded in the hardware (such as the time certification component 104), not in the software (such as the operating program). This embodiment does not limit when or how the authorization start time and the authorization end time are written into the time certification component 104.

Figure 2:
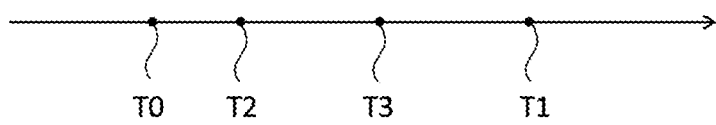
FIG. 2 is an operation sequence diagram of the electronic component testing system in accordance with an embodiment of the present invention.

As an example, when the test instruction is sent from the interface device 12, the time certification component 104 will check the information in the test instruction to determine whether to start the test procedure. In addition to the command for controlling the testing device 10 to execute the test procedure, the test instruction may also include a system time information of the interface device 12, and the time certification component 104 is used to check a system time information. In one example, the test instruction may include the first execution time indicating the test procedure is started, or the first stop time indicating the test procedure is stopped or completed. Please refer to FIG. 1 and FIG. 2 together. FIG. 2 is an operation sequence diagram of the electronic component testing system in accordance with an embodiment of the present invention. As shown in the figures, this embodiment marks the authorization start time and authorization end time, written into the time certification component 104 in advanced, as T0 and T1, respectively. It can be seen from the FIG. 2 that the authorization start time T0 should be earlier than the authorization end time T1.

When the user operates the interface device 12 to give a test instruction requesting to start the test procedure, the time certification component 104 checks the system time information contained in the test instruction. Assuming that the system time information (i.e. the first execution time T2) given by the test instruction indicating the test procedure is started, the time certification component 104 checks whether the first execution time T2 is later than the authorization start time T0. Taking FIG. 2 as an example, the first execution time T2 is indeed later than the authorization start time T0, the time certification component 104 can generate a certification pass signal accordingly, and the testing device 10 will start the test procedure only after receiving the certification pass signal. Of course, the time certification component 104 can also generate the certification pass signal based on other conditions. For example, the time certification component 104 can check the operation sequence between the first execution time T2 and the authorization start time T0. The time certification component 104 can also check the operation sequence between the first execution time T2 and the authorization end time T1. For example, the time certification component 104 checks whether the first execution time T2 is earlier than the authorization end time T1. When the first execution time T2 is later than the authorization start time T0, and the first execution time T2 is earlier than the authorization end time T1, it means that the test procedure can be started legally because the test instruction send by the interface device 12 is in the authorization period, i.e. the first execution time T2 is between the authorization start time T0 and the authorization end time T1. At this time, the time certification component 104 can generate the certification pass signal.

On the contrary, person having ordinary skill in the art should understand that if the time certification component 104 checks that the first execution time is earlier than the authorization start time T0, it means that the authorization period has not yet started, or the authorization has not yet been given to customers. At this time, the time certification component 104 will not generate the certification pass signal, which prevents the customer from starting to use the testing device 10 too early. In addition, if the time certification component 104 checks that the first execution time is later than the authorization end time T1, it means that the authorization period has passed, and the time certification component 104 also does not generate the certification pass signal to prevent the customer from using the testing device 10 overdue. In other words, by checking the first execution time T2, the authorization start time T0, and the authorization end time T1, the time certification component 104 can determine whether it is currently in the authorization period and decide whether to let the testing device 10 start the test procedure.

On the other hand, when the user operates the interface device 12 to send the test instruction to end the test procedure, the time certification component 104 will also check the system time information contained in the test instruction. Assuming that the system time information (that is, the first stop time) given by the test instruction to end the test procedure is T3, the time certification component 104 will detect that the test procedure has ended, and update the authorization start time T0 to the first stop time T3. In other words, this embodiment does not only record the first stop time T3, but after the previous test procedure ends, the first stop time T3 of the previous test procedure is used as the new authorization start time T0. Therefore, when the interface device 12 gives a new test instruction to start the test procedure next time, the authorization start time checked by the time certification component 104 is the previous first stop time T3. The new authorization start time will be shifted backward to T3 and closer to the authorization end time T1, so that modifying the authorization start time T0 strategy will shorten the authorization period after each use.

Figure 3:
FIG. 3 is an operation sequence diagram of the electronic component testing system in accordance with another embodiment of the present invention.

In practice, there may still be users who try to provide the wrong first stop time (fake T3) to the time certification component 104. For example, by deliberately modifying the system time information of the interface device 12, so that the interface device 12 would send the test instruction having the incorrect system time information. For the convenience of description, please refer to FIG. 1 and FIG. 3 together. FIG. 3 is an operation sequence diagram of the electronic component testing system in accordance with another embodiment of the present invention. Taking FIG. 3 as an example, since the first execution time T2 is between the authorization start time T0 and the authorization end time T1, the time certification component 104 will determine that it is currently in a legal authorization period, so that the time certification component 104 allows the testing device 10 to start the test procedure. However, suppose the user deliberately modified the system time information of the interface device 12, so that the interface device 12 sends the test instruction to end the test procedure having the incorrect system time information, that is, the incorrect first stop time T4. At this time, the incorrect first stop time T4 may be modified to be earlier than the first execution time T2 as shown in FIG. 3. It looks like the test procedure has stopped before it is started, and the logical problem needs to be corrected.

In order to deal with this type of logical problem causing by deliberately modifying the system time information, the time certification component 104 of this embodiment may perform an additional check before updating the authorization start time T0. For example, the time certification component 104 may first check whether the first execution time T2 is earlier than the first stop time T4. Logically, the first execution time T2 should be earlier than the first stop time T4. As shown in FIG. 3, because the user maliciously modifies the system time information of the interface device 12, the first stop time T4 is now earlier than the first execution time T2. In one example, when the time certification component 104 detects that the first stop time T4 is earlier than the first execution time T2, the testing device 10 can automatically send a warning notification to remind the machine owner or company. In addition, it is more important that the time certification component 104 should correctly update the authorization start time T0. In practice, the time certification component 104 of this embodiment can also measure or calculate the time by itself. For example, the time certification component 104 maintains or has an internal timing value.

Figure 4:
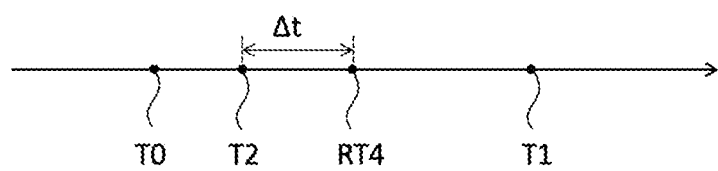
FIG. 4 is an operation sequence diagram of the electronic component testing system in accordance with the other embodiment of the present invention.

Please refer to FIG. 1 and FIG. 4 together. FIG. 4 is an operation sequence diagram of the electronic component testing system in accordance with the other embodiment of the present invention. As shown in the figures, when the time certification component 104 detects that the first stop time T4 is earlier than the first execution time T2, the time certification component 104 will cancel updating the authorization start time T0 with the wrong first stop time T4, but add the internal timing value to the first execution time T2 to obtain the real stop time of the test procedure. Here, assuming that the internal timing value counted by the time certification component 104 is Δt, the time certification component 104 can obtain the real stop time RT4 after adding the internal timing value Δt to the first execution time T2. Then, the time certification component 104 will update the authorization start time T0 with the real stop time RT4. In other words, the time certification component 104 of this embodiment can automatically adjust the incorrect system time information. Therefore, when the testing device 10 performs the test procedure next time, the new authorization start time will be RT4.

Following the above, it is assumed that the user's modification of the system time information is not particularly serious. For example, the incorrect first stop time T4 is not advanced to earlier than the first execution time T2, but only slightly earlier than it should be. Or, if the incorrect first stop time T4 is locked to a specific time, the time certification component 104 of this embodiment still has the opportunity to check out the behavior of modifying the system time information. For example, the time certification component 104 can periodically or randomly check the system time information, and compare checked data to determine whether the user has modified the system time information. As shown in FIG. 2, the time certification component can calculate the time length of the performing test procedure from the recorded first execution time T2 and the first stop time T3, and compare the time length of the performing test procedure recorded in the internal timing value. If there is a difference or difference exceeding the acceptable value, the testing device 10 can also automatically issue a warning notification to remind the machine owner or company, and update the next authorization start time with the aforementioned real stop time. Of course, if the time certification component 104 has ever detected that the system time information is incorrect, the time certification component 104 can also automatically increase the frequency of checking the system time information to prevent such behavior and protect the rights of the machine owner or company.

Figure 5:
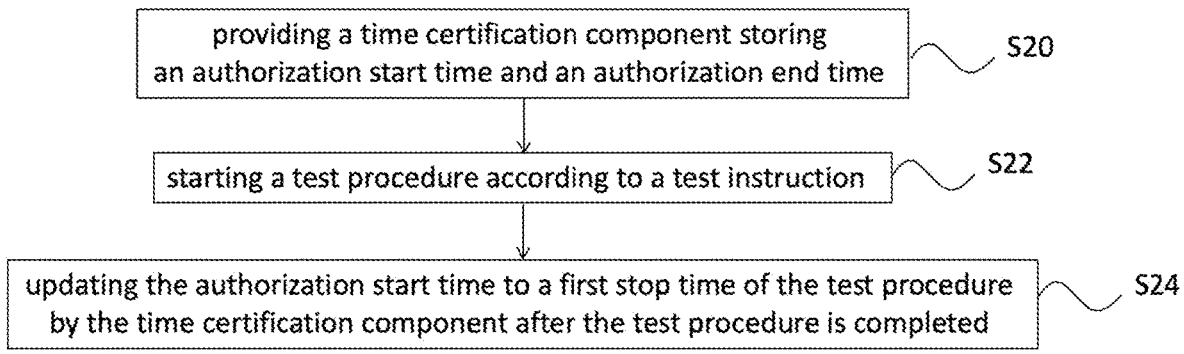
FIG. 5 is a flow chart of the time certification method in accordance with an embodiment of the present invention.

In order to explain the time certification method of the present invention, please refer to FIG. 1 and FIG. 5 together. FIG. 5 is a flow chart of the time certification method in accordance with an embodiment of the present invention. As shown in the figures, in step S20, the electronic component testing system 1 comprises the time certification component 104, and the time certification component 104 can store the authorization start time and the authorization end time. In step S22, the testing device 10 in the electronic component testing system 1 can start the test procedure according to the test instruction, and the test instruction may be given by the interface device 12. In step S24, after the test procedure of the testing device 10 ends, the time certification component 104 may update the authorization start time to the first stop time when the test procedure ends. The steps and procedures of the time certification method in this embodiment have been fully described in the foregoing embodiments of the electronic component testing system 1, and will not be repeated in this embodiment.

In summary, the electronic component testing system and the time certification method provided by the present invention comprise a time certification component, embedded in the machine that cannot be bypassed, to determine the authorization period. Therefore, the present invention can prevent the internal time of the machine from being modified to avoid checking the authorization period. In addition, the time certification component provided by the present invention can check whether the internal time of the machine has been modified before automatically updating the authorization period. If the time certification component determines that the internal time of the machine is incorrect or modified, it will update the authorization period time bases on its internal timing value.

What is claimed is:

1. An electronic component testing system, comprising:
   a testing device comprising a backboard, electrically connected to at least one test board and comprising a time certification component; and
   an interface device, electrically connected to the testing device, providing a test instruction;
   wherein the time certification component stores an authorization start time and an authorization end time;
   wherein the testing device starts a test procedure according to the test instruction, the time certification component updates the authorization start time to a first stop time of the test procedure after the test procedure is completed.

2. The electronic component testing system according to claim 1, wherein when the testing device receives the test instruction, the time certification component checks whether a first execution time of the test instruction is later than the authorized start time to determine whether the testing device starts the test procedure.

3. The electronic component testing system according to claim 2, wherein when the first execution time is later than the authorization start time, the time certification component generates a certification pass signal, and the testing device starts the test procedure according to the certification pass signal.

4. The electronic component testing system according to claim 3, wherein when the first execution time is not later than the authorization start time, the time certification component does not generate the certification pass signal.

5. The electronic component testing system according to claim 2, wherein when the testing device receives the test instruction, the time certification component checks whether the first execution time of the test instruction is earlier than the authorized end time to determine whether the testing device starts the test procedure.

6. The electronic component testing system according to claim 5, wherein when the first execution time is earlier than the authorized end time, the time certification component generates a certification pass signal, and the testing device starts the test procedure according to the certification pass signal.

7. The electronic component testing system according to claim 6, wherein when the first execution time is not earlier than the authorized end time, the time certification component does not generate the certification pass signal.

8. The electronic component testing system according to claim 1, wherein before the time certification component updates the authorization start time to the first stop time, the time certification component checks whether the first execution time of the test instruction is earlier than the first stop time.

9. The electronic component testing system according to claim 8, wherein when the first execution time is not earlier than the first stop time, the time certification component adds an internal timing value to the first execution time to obtain a real stop time, and the time certification component updates the authorization start time to the real stop time.

10. A time certification method, comprising:
provided a time certification component storing an authorization start time and an authorization end time;
starting a test procedure according to a test instruction; and
updating the authorization start time to a first stop time of the test procedure by the time certification component after the test procedure is completed.

11. The time certification method according to claim 10, wherein in the step of starting the test procedure according to the test instruction, further comprising:
checking whether a first execution time of the test instruction is later than the authorized start time by the time certification component;
generating a certification pass signal by the time certification component when the first execution time is later than the authorization start time; and
starting the test procedure according to the certification pass signal.

12. The time certification method according to claim 11, wherein when the first execution time is not later than the authorization start time, the time certification component does not generate the certification pass signal.

13. The time certification method according to claim 11, wherein in the step of starting the test procedure according to the test instruction, further comprising:
checking whether a first execution time of the test instruction is earlier than the authorized end time by the time certification component;
generating a certification pass signal by the time certification component when the first execution time is earlier than the authorized end time; and
starting the test procedure according to the certification pass signal.

14. The time certification method according to claim 13, wherein when the first execution time is not earlier than the authorized end time, the time certification component does not generate the certification pass signal.

15. The time certification method according to claim 10, wherein before the step of updating the authorization start time to the first stop time of the test procedure, further comprising:
checking whether a first execution time of the test instruction is earlier than the first stop time by the time certification component;
adding an internal timing value to the first execution time to obtain a real stop time by the time certification component when the first execution time is not earlier than the first stop time; and
updating the authorization start time to the real stop time by the time certification component.

* * * * *